United States Patent
Lu et al.

(10) Patent No.: US 8,809,918 B2
(45) Date of Patent: Aug. 19, 2014

(54) MOSFETS WITH MULTIPLE DISLOCATION PLANES

(75) Inventors: Wei-Yuan Lu, Taipei (TW); Li-Ping Huang, Taipei (TW); Han-Ting Tsai, Kaoshiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 196 days.

(21) Appl. No.: 13/280,094

(22) Filed: Oct. 24, 2011

(65) Prior Publication Data
US 2013/0099294 A1    Apr. 25, 2013

(51) Int. Cl.
*H01L 29/76*    (2006.01)

(52) U.S. Cl.
USPC .......................................... 257/288; 257/213

(58) Field of Classification Search
USPC .................................. 257/288, 213
See application file for complete search history.

(56) References Cited

U.S. PATENT DOCUMENTS

2010/0038685 A1    2/2010    Weber et al.

OTHER PUBLICATIONS

Packan, P., et al., "High Performance 32nm Logic Technology Featuring $2^{nd}$ Generation High-k + Metal Gate Transistors," 2009 IEEE International Electron Devices Meeting (IEDM), Dec. 7-9, 2009, pp. 28.4.1.-28.4.4.

*Primary Examiner* — Douglas Menz
(74) *Attorney, Agent, or Firm* — Slater and Matsil, L.L.P.

(57) ABSTRACT

A method includes forming a metal-oxide-semiconductor field-effect transistor (MOSFET), which includes forming a first dislocation plane adjacent to a gate electrode of the MOSFET, and forming a second dislocation plane adjacent to the gate electrode of the MOSFET. The first and the second dislocation planes are on a same side of the gate electrode, and extend into source/drain regions of the MOSFET.

15 Claims, 6 Drawing Sheets

US 8,809,918 B2

MOSFETS WITH MULTIPLE DISLOCATION PLANES

BACKGROUND

To enhance the performance of metal-oxide-semiconductor (MOS) devices, stresses may be introduced into the channel regions of the MOS devices to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction. Techniques for improving the stresses in the MOS devices are thus explored.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A metal-oxide-semiconductor field-effect transistor (MOSFET) and the method of forming the same are provided in accordance with various embodiments. The intermediate stages of forming the MOSFET are illustrated. The variations and the operation of the embodiments are discussed. Throughout the various views and illustrative embodiments, like reference numbers are used to designate like elements.

Figure 1:
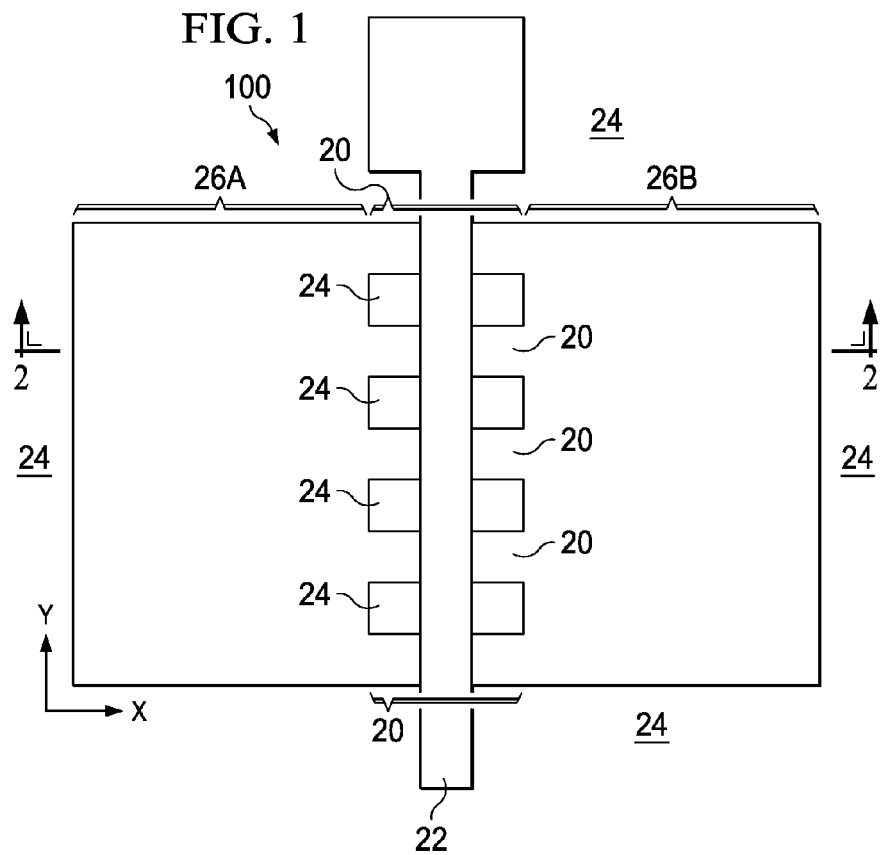
FIG. 1 illustrates a top view of a metal-oxide-semiconductor field-effect transistor (MOSFET)

FIG. 1 illustrates a top view of n-type MOSFET 100 in accordance with various embodiments. MOSFET 100 is a tri-gate MOSFET (sometimes known as a FinFET), and includes at least one, and possibly more, semiconductor fins 20. Semiconductor fins 20 are spaced apart from each other, with insulation regions (which may be shallow trench isolation (STI) regions) 24 therebetween. Gate electrode 22 is formed on semiconductor fins 20 and covers the top surfaces of semiconductor fins 20. Gate electrode 22 also wraps round the sidewalls of semiconductor fins 20. Bulk active regions 26 are on the opposite ends of semiconductor fins 20, wherein bulk active region 26A interconnects portions of semiconductor fins 20 on the left side of gate electrode 22. Bulk active region 26B interconnects portions of semiconductor fins 20 on the right side of gate electrode 22.

Figure 2:
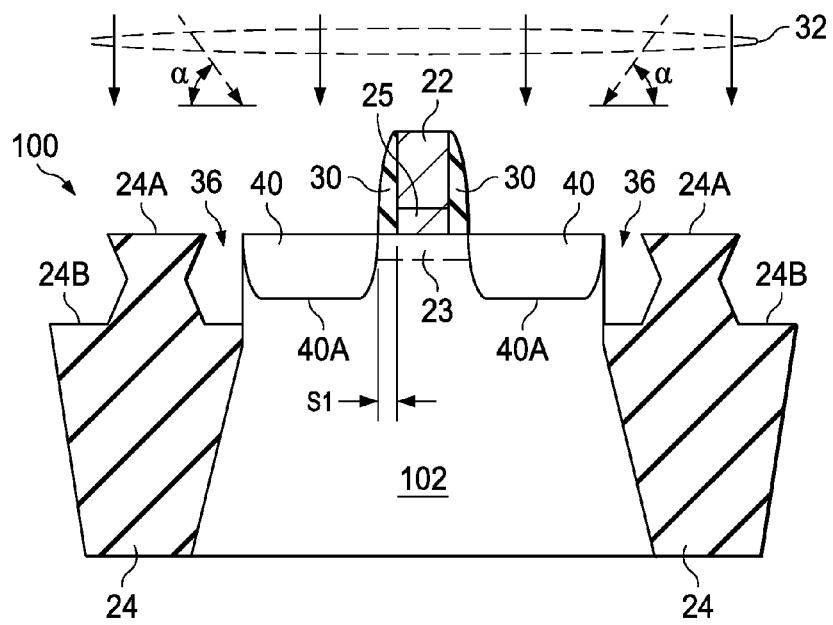
FIGS. 2 through 11 are cross-sectional views of intermediate stages in the manufacturing of the MOSFET in accordance with various embodiments.

FIGS. 2 through 11 are cross-sectional views of intermediate stages in the manufacturing of n-type MOSFET 100 in accordance with some embodiments. The cross-sectional views are taken from the plane crossing line 2-2 In FIG. 1. Referring to FIG. 2, semiconductor substrate 102 is provided, and STI regions 24 are formed to extend from the top surface of semiconductor substrate 102 into semiconductor substrate 102. Semiconductor substrate 102 may be a silicon substrate, a silicon germanium substrate, or may comprise other semiconductor materials such as III-V compound semiconductor materials. On the sidewall of gate electrode 22 and gate electrode 25, main offset spacers 30 are optionally formed. Main offset spacers 30 may be formed of a dielectric material such as silicon oxide, although other dielectric materials such as silicon nitride, silicon oxynitride, or the like may also be used. STI regions 24 comprise recesses 36, which are formed by recessing the portions of STI regions 24 that adjoin semiconductor substrate 102. Accordingly, STI regions 24 have top surfaces 24A and recessed top surfaces 24B, with recessed top surfaces 24B lower than top surfaces 24A. The portions of substrate 102 that are over recessed top surfaces 24B thus form semiconductor fins 20 (please refer to FIG. 1) and bulk semiconductor regions 26A and 26B (FIG. 1). In some embodiments, recesses 36 may encircle semiconductor fins 20 and bulk semiconductor regions 26A and 26B. Channel region 23 is thus formed in semiconductor substrate 102, and is under gate electrode 22.

A first pre-amorphization implantation (PAI, also sometimes referred to as pre-amorphous implantation), as symbolized by arrows 32, is then performed. In some embodiment, silicon or germanium is implanted. In other embodiments, inert gases such as neon, argon, xenon, and radon are implanted. The pre-amorphization implantation destroys the lattice structure of semiconductor substrate 102. When germanium is implanted, the implantation energy may be between about 25 keV and about 40 keV, and the implantation dosage may be between about $1E14/cm^2$ and about $1E15/cm^2$. The implantation may be performed when semiconductor substrate 102 is at a temperature between about $-60°$ C. and about $-100°$ C. in some exemplary embodiments.

After the first PAI, exposed top portions of semiconductor substrate 102, which portions include semiconductor fins 20 and bulk semiconductor regions 26A and 26B are turned into an amorphous state as a result of the PAI. PAI regions 40 are thus formed. In an embodiment, the implantation is performed vertically. In alternative embodiments, the implantation may be performed at tilt angles $\alpha$, which may be smaller than about 20 degrees. When the tilt implantation is performed, two tilt implants may be performed and tilt to opposite directions, as illustrate by dashed arrows 32.

The bottom surface 40A of PAI regions 40 may be higher than recessed top surfaces 24B of STI regions 24 to ensure that dislocation pinch-off lines 48 (FIG. 3) are higher than recessed STI top surfaces 24B. When the vertical implantation is performed and when no offset spacer 30 is formed, the inner edges of PAI regions 40 may be substantially aligned to edges of gate electrode 22 (so that distance S1 is substantially equal to zero nm). Alternatively, PAI regions 40 may be spaced apart from the respective closest edge of gate electrode 22 by distance S1, which is a non-zero value. On the other hand, when the tilt implantation is performed, PAI regions 40 may, or may not, extend to directly under gate electrode 22.

Figure 3:
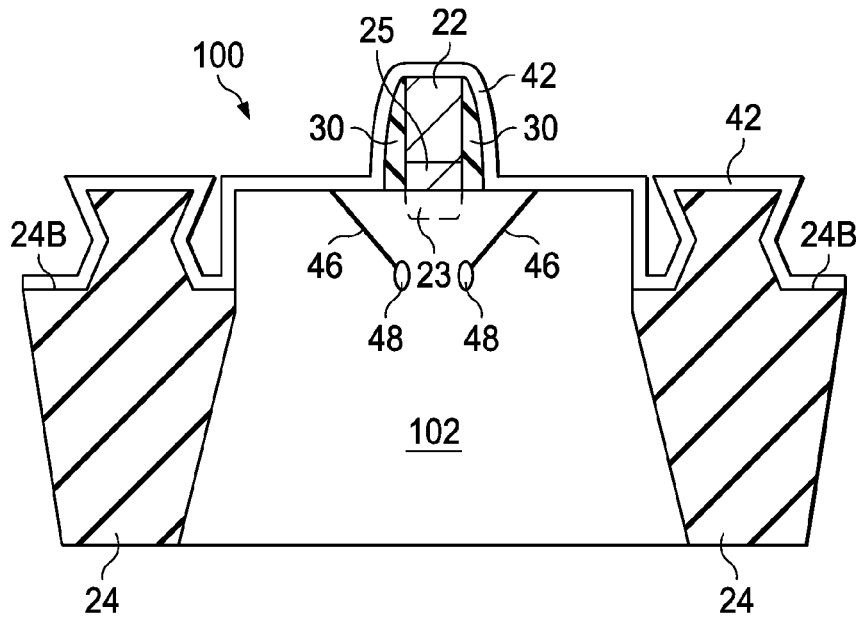

FIG. 3 illustrates the formation of a first strained capping layer 42. The materials of strained capping layer 42 may include silicon nitride, titanium nitride, oxynitride, oxide, SiGe, SiC, SiON, and combinations thereof. Strained capping layer 42 may have an inherent tensile stress. The formation process is adjusted to change the stress to a desirable value. In some embodiments, strained capping layer 42 includes a single layer. In other embodiments, strained capping layer 42 may have a laminated structure with multiple layers.

An anneal is then performed, for example, using rapid thermal anneal (RTA), thermal spike RTA anneal, or other anneal methods. In an embodiment, the anneal is performed using spike RTA, with the annealing temperature between about 950° C. and about 1050° C., for about 3 ms to 5 seconds, for example. In alternative embodiments, the anneal may be performed using long time RTA, with a anneal temperature between about 550° C. and about 950° C., for a duration between about ten seconds and about five minutes, for example. As a result of the anneal, PAI regions 40 as in FIG. 2 are recrystallized with a memorized stress obtained from strained capping layer 42. Accordingly, semiconductor substrate 102 may apply a tensile stress to channel region 23 of the resulting MOSFET 100, so that the drive current of MOSFET 100 is improved.

As the result of the annealing, dislocation planes 46 are formed. Although illustrated as lines in the cross-sectional view shown in FIG. 3, dislocation planes 46 are planes that extend in the longitudinal direction of gate electrode 22, which is also the Y direction in FIG. 1. The bottom points 48 of dislocation planes 46 may be higher than recessed top surfaces 24B of STI regions 24. This may minimize the impact of STI regions 24, which adversely apply compressive stress to channel 23. Bottom points 48 form lines extending in the Y direction in FIG. 1, and hence are referred to as pinch-off lines 48 hereinafter.

Figure 4:
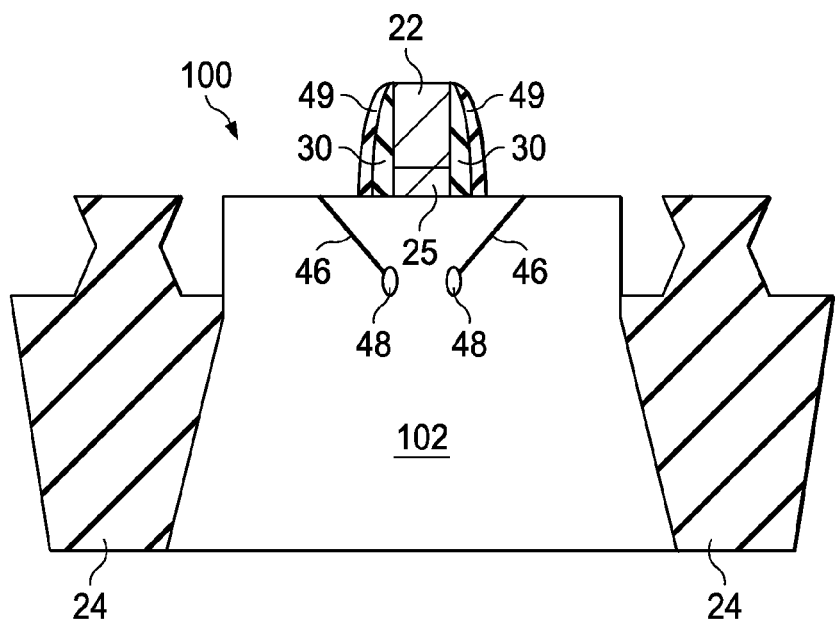

Next, referring to FIG. 4, an etch step is performed, and the horizontal portions of strained capping layer 42 are removed, while some of the vertical portions of strained capping layer 42 remain. Remaining portions of strained capping layer 42 are referred to as offset spacers 49 hereinafter. Offset spacers 49 are on the sidewalls of main offset sidewall spacers 30, or on the sidewalls of gate electrode 22 if main offset sidewall spacers 30 are not formed. It is noted that the remaining portions of strained capping layer 42 may also include portions on the sidewalls of substrate 102 and STI regions 24, and these portions are not illustrated.

Figure 5:
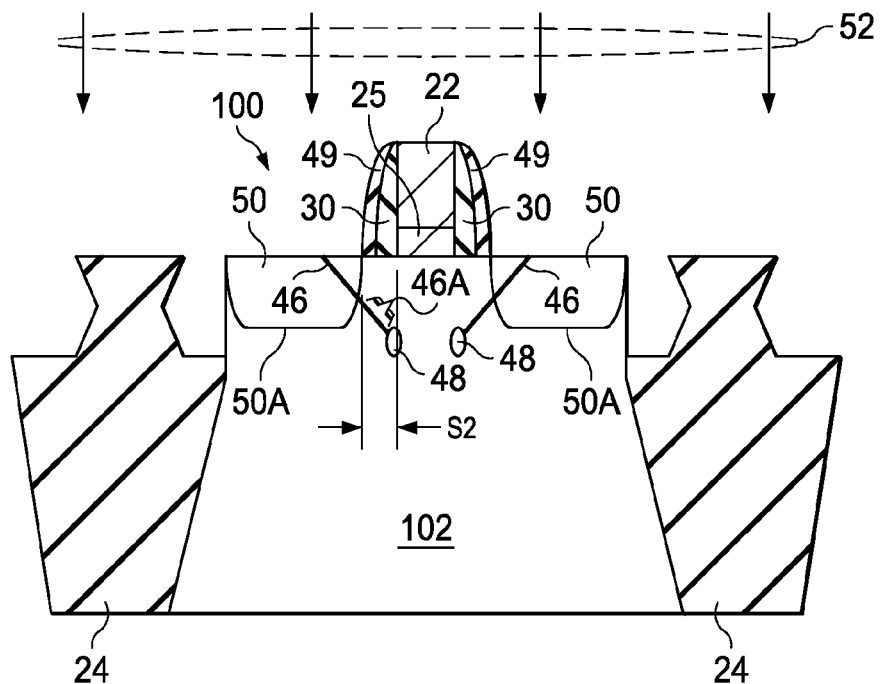

FIG. 5 illustrates the formation of second PAI regions 50 through a second PAI implantation, which PAI implantation is illustrated using arrows 52. The second PAI implantation is performed with offset spacers 49 blocking some of the implanted elements. Accordingly, inner edges 50A of PAI regions 50 are farther away from the respective gate electrode 22 than the respective PAI regions 40 (FIG. 2). Alternatively stating, horizontal spacing S2, which is the spacing between the inner edges of PAI regions 50 and the respective nearest edges of gate electrode 22, is greater than horizontal spacing S1 in FIG. 2. Furthermore, at least a bottom portion 46A of each of dislocation planes 46 is not located inside the newly formed PAI regions 50. This may be achieved by making PAI regions 50 shallower than pinch-off lines 48. Alternatively, this may be achieved by using offset spacers 49 in the second PAI to space PAI regions 50 away from gate electrode 22, as illustrated in FIG. 5. The portions of dislocation planes 46 that overlap PAI regions 50 are destroyed since PAI regions 50 are amorphous regions. The second PAI may be formed vertically, or tilted using a tilt angle equal to or smaller than tilt angle α (FIG. 2) of the first PAI implantation. This may ensure that the subsequent formed dislocation planes 56 (FIG. 6) do not overlap dislocation planes 46. The implanted element may be selected from the similar available elements that may be used by the first PAI. When germanium is implanted, the implantation energy may be between about 15 keV and about 50 keV, and the implantation dosage may be between about $1E14/cm^2$ and about $1E15/cm^2$. The implantation may be performed when semiconductor substrate 102 is at a temperature between about −60° C. and about −100° C.

Figure 6:
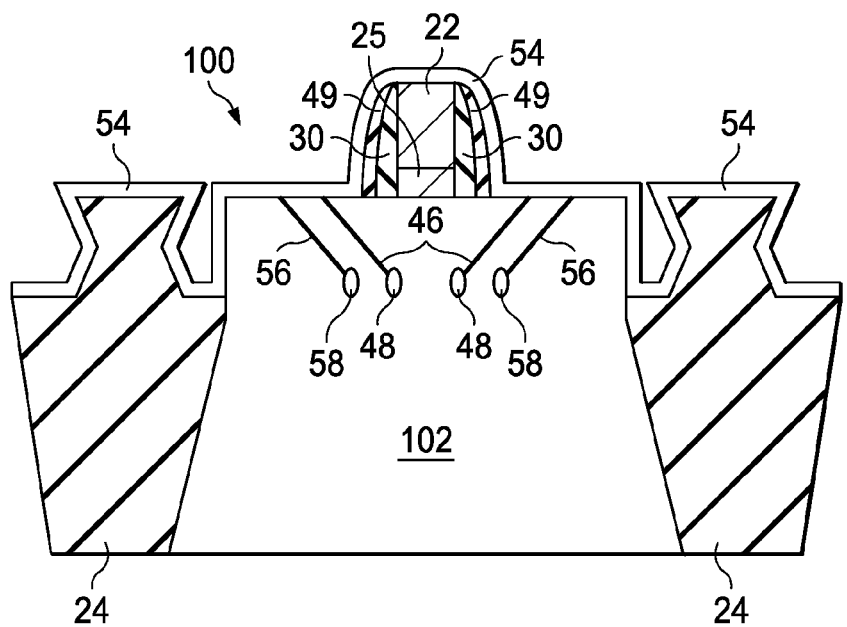

FIG. 6 illustrates the formation of second strained capping layer 54. The candidate materials and formation methods of strained capping layer 54 may be essentially the same as that are used for forming strained capping layer 42. After the formation of strained capping layer 54, a second annealing is performed. Similarly, the second annealing may be essentially the same as the first annealing shown in FIG. 3. As a result of the second annealing, recrystallization occurs in PAI regions 50, and dislocation planes 56 are generated. In the meantime, since bottom portions 46A of dislocation planes 46 were not destroyed by the second PAI, the destroyed portions of dislocation planes 46 regrow in PAI region 50, which are converted to crystalline regions again. In the resulting structure as in FIG. 6, two dislocation planes 46 and 56 coexist, and are parallel to each other, with dislocation planes 56 being on the outer sides of the respective dislocation planes 46. Furthermore, pitch-off lines 48 and 58 of respective dislocation planes 46 and 56 are higher than recessed STI top surfaces 24B of STI regions 24. Alternatively stated, pitch-off lines 48 and 58 may be higher than the bottoms of the respective fins 20, which fin bottoms are at the same level as recessed STI top surfaces 24B of STI regions 24.

Figure 7:
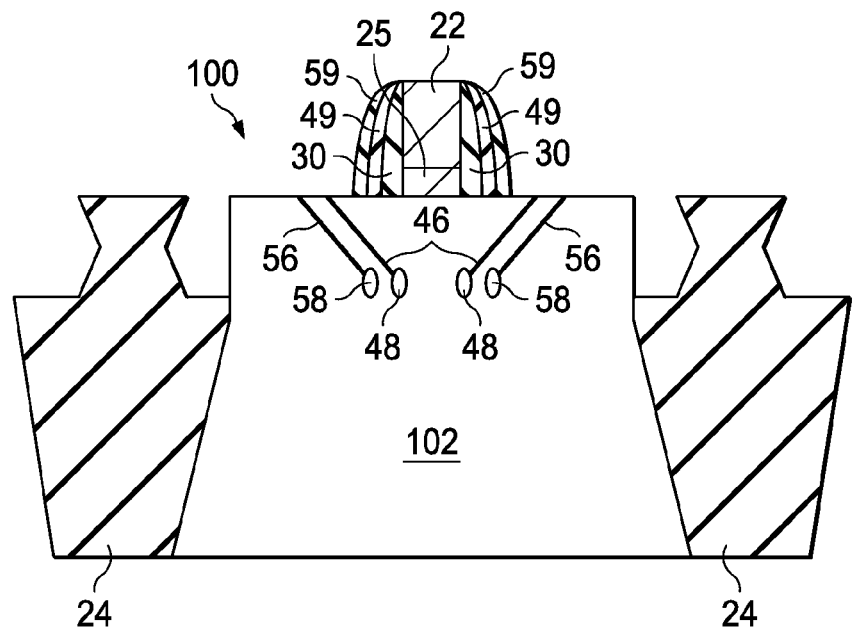
Figure 8:
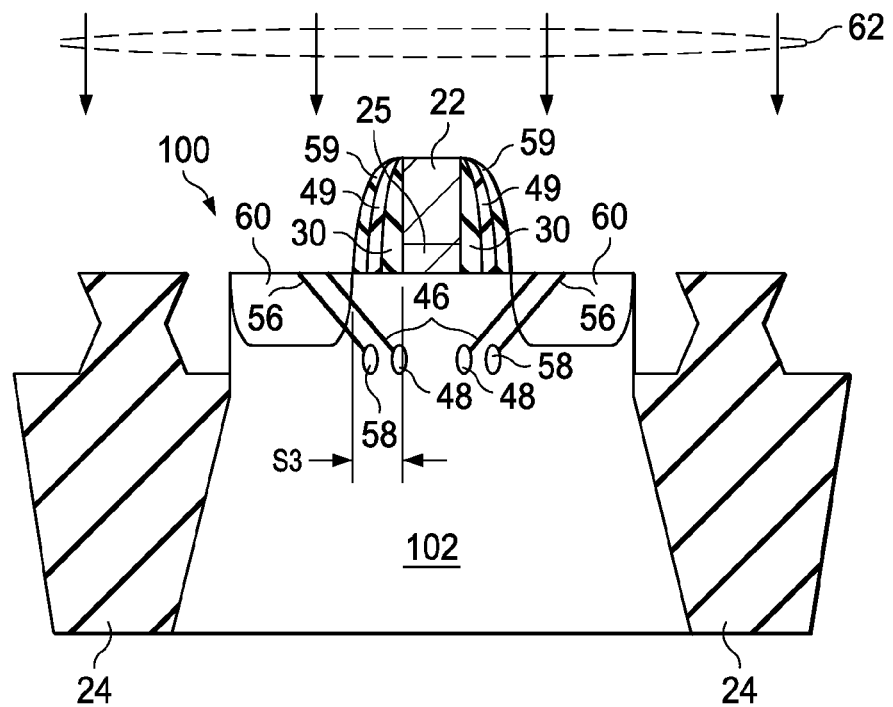

Next, as shown in FIG. 7, an etch step is performed, so that the horizontal portions of strained capping layer 54 are removed, while some vertical portions of strained capping layer 54 are left on offset spacers 49 to form offset spacer 59. In subsequent process steps as shown in FIG. 8, a third PAI 62 is performed to form third PAI regions 60. The third PAI may be essentially the same as the second PAI in FIG. 5. Again, each of dislocation planes 46 and 56 has a bottom portion not overlapped with PAI regions 60, and the bottom portions of dislocation planes 46 and 56 are not destroyed during the third PAI 62. The process details of the third PAI 62 may be essentially the same as the second PAI 52 (FIG. 5). Due to the addition of offset spacers 49 and 59, PAI regions 60 are farther away from gate electrode 22 than PAI region 50 (FIG. 5), with spacing S3 greater than spacing S1 and spacing S2, as shown in FIGS. 2 and 5, respectively.

Figure 9:
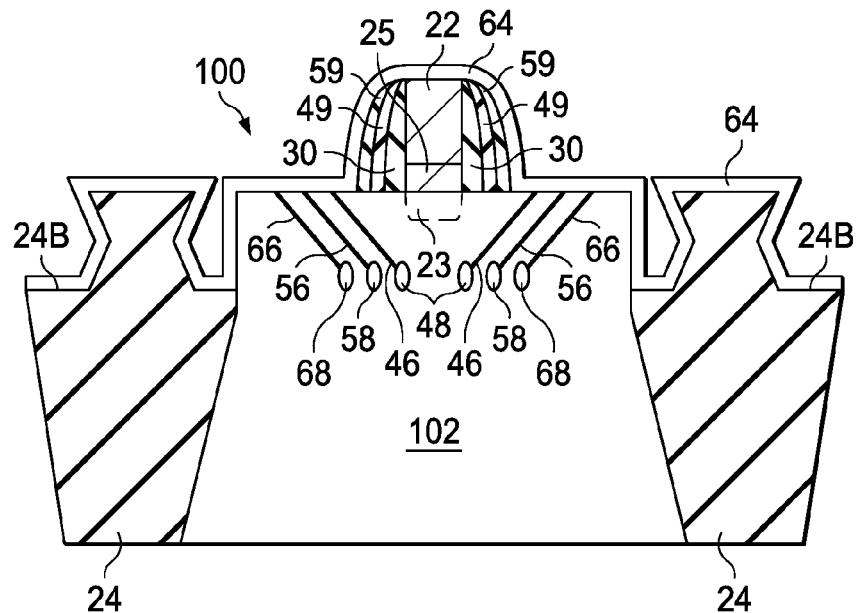

Referring to FIG. 9, a third strained capping layer 64 is formed, followed by a third annealing step to form dislocation planes 66 on the outer sides of dislocation planes 46 and 56. Furthermore, dislocation planes 46, 56 and 66 are parallel to each other. The pitch-off lines 68 of dislocation planes 66 may be higher than recessed top surfaces 24B of STI regions 24.

The formation of dislocation planes 46, 56, and 66 may cause an increase in the tensile stress in channel region 23 of MOSFET 100. The formation of more dislocation planes may cause the tensile stress to be further increased. Simulation has been made to study the relationship between the channel stress and the number of dislocation planes in MOS devices. The results indicated that the channel stress of MOSFETs with two dislocation planes (on each side of gate electrode 22) is 1.5 times the channel stress of MOSFETs that have one dislocation plane, and the channel stress of MOSFETs with three dislocation planes is 1.7 times the channel stress of MOSFETs with two dislocation planes. Therefore, forming more dislocation planes may effectively increase the channel stresses in the respective MOSFETs.

FIGS. 2 through 9 illustrate the formation of a MOSFET with three dislocation planes. In alternative embodiments, a MOSFET may have two dislocation planes or more than three dislocation planes on each side of the gate electrode.

Figure 10:
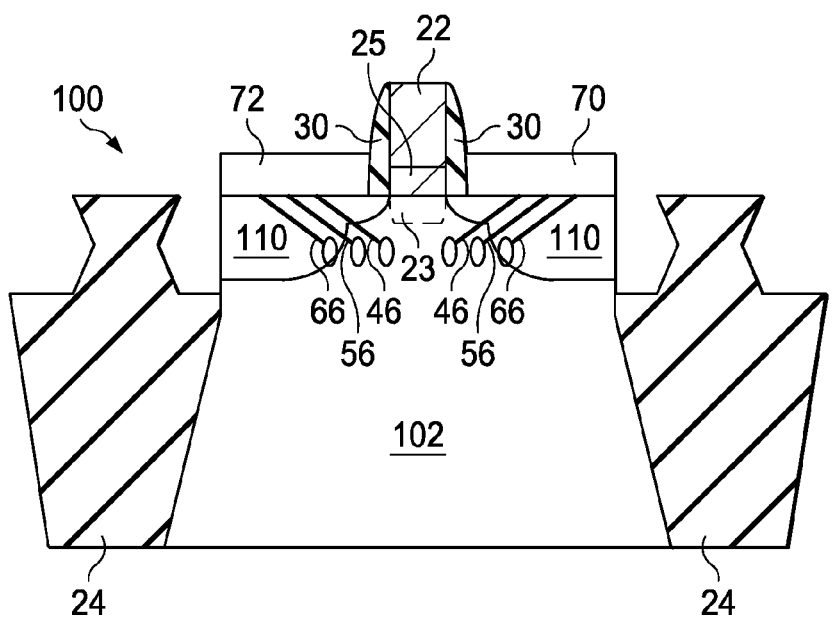

Referring to FIG. 10, strained capping layer 64 and offset spacers 49 and 59 are removed. The removal of offset spacers 49 and 59 may be performed using $H_3PO_4$ when strained capping layer 64 and offset spacers 49 and 59 comprise silicon nitride, for example. An epitaxial growth may then be performed to grow epitaxy semiconductor layer 70 on the top surface of source/drain regions 110. In an embodiment, epitaxy semiconductor layer 70 comprises silicon, silicon phosphorus, silicon carbon phosphorus, or the like.

Figure 11:
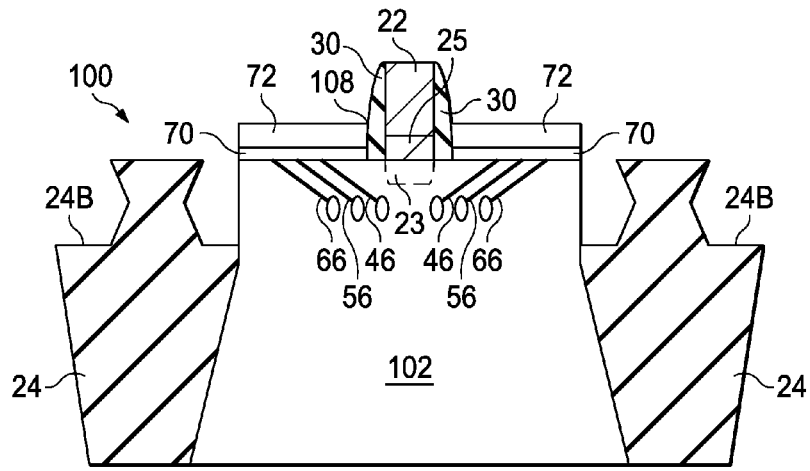

Next, as shown in FIG. 11, a silicidation is performed to form silicide regions 72. In an embodiment, the top portions of epitaxy semiconductor layer 70 are consumed in the silicidation, while the bottom portions of epitaxy semiconductor layer 70 are not consumed in the silicidation. Accordingly, the bottom surfaces of the resulting silicide regions 72 are higher than the top surface of the channel region 23 of MOSFET 100. Simulation results have indicated that when the bottom surface of silicide regions 72 are higher than the top surface of channel region 23, the drive current of MOSFET 100 may be improved, and the improvement increases when the bottom surfaces of silicide regions are higher.

Figure 12:
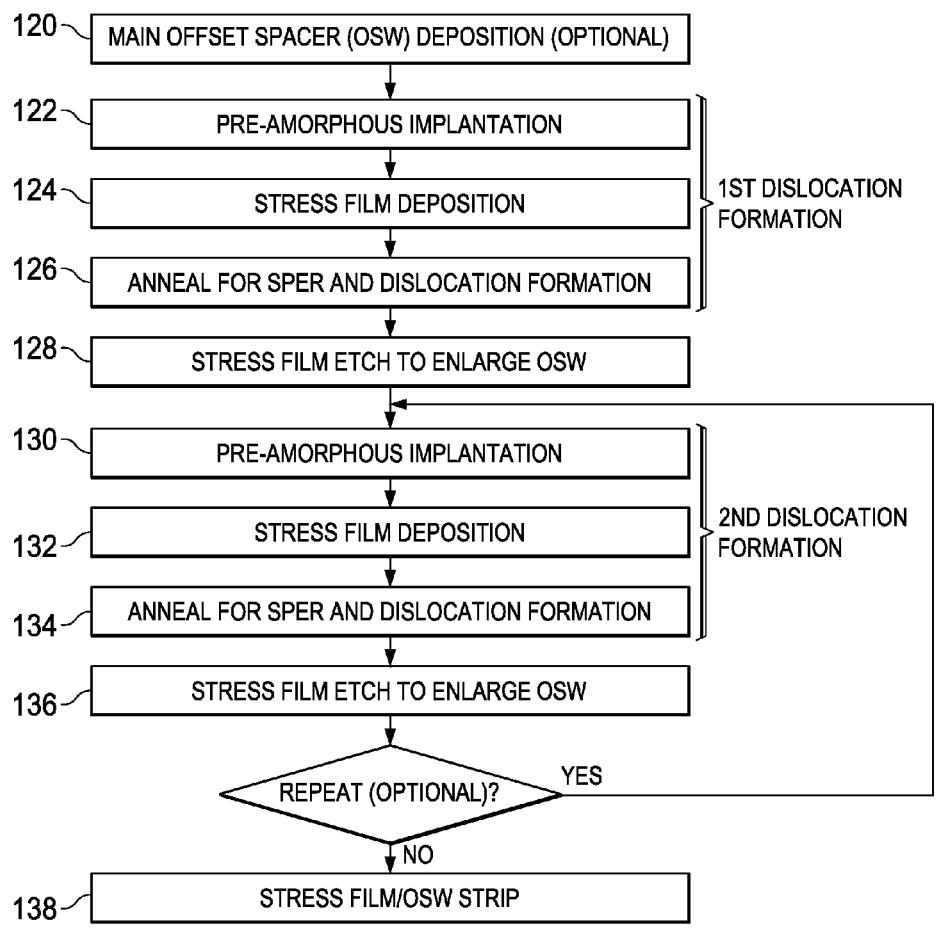
FIG. 12 is a process flow in accordance with embodiments.

FIG. 12 illustrates an exemplary process flow for forming dislocations. First, main offset spacers are formed (step 120). Step 120 in FIG. 12 may correspond to the step shown in FIG. 2. The first dislocation formation is then performed by steps 122, 124, and 126. In step 122, a pre-amorphous implantation is performed, followed by the stress film deposition and the anneal for forming dislocations, as in steps 124 and 126. Steps 122, 124, and 126 may correspond to the steps shown in FIGS. 2 through 4. Next, the stress film is etched to enlarge the size of offset spacers. This step may correspond to the etch step in FIG. 4. A second dislocation formation is performed by steps 130, 132, 134, and 136. In step 130, an additional pre-amorphous implantation is performed, followed by an additional stress film deposition and an additional anneal for forming dislocations (steps 132 and 134). In step 136, the additional stress film is etched to enlarge the size of the offset spacers. Steps 130, 132, 134, and 136 may correspond to the steps shown in FIGS. 5 through 7. Steps 130, 132, 134, and 136 may be repeated one more time or a plurality of times. For example, the steps shown in FIGS. 8 and 9 illustrate an exemplary repetition of steps 130, 132, 134, and 136. Step 138 illustrates the removal of stress films and optional main offset sidewall spacers. Step 138 may correspond to the exemplary step shown in FIG. 10.

In accordance with embodiments, a method includes forming a MOSFET, which includes forming a first dislocation plane adjacent to a gate electrode of the MOSFET, and forming a second dislocation plane adjacent to the gate electrode of the MOSFET. The first and the second dislocation planes are on a same side of the gate electrode, and extend into source/drain regions of the MOSFET.

In accordance with other embodiments, a method includes performing a first implantation to form a first PAI region adjacent to a gate electrode of a MOSFET, forming a first strained capping layer over the first PAI region, performing a first annealing to the first strained capping layer and the first PAI region to form a first dislocation plane in a semiconductor region adjacent to the gate electrode, and etching the first strained capping layer to remove horizontal portions. A vertical portion of the first strained capping layer adjacent to the gate electrode is left un-etched, and forms an offset spacer. After the step of etching, a second implantation is performed to form a second PAI region adjacent to the gate electrode. The method further includes forming a second strained capping layer over the second PAI region, and performing a second annealing to the second strained capping layer and the second PAI region, wherein a second dislocation plane is formed as a result of the second annealing.

In accordance with yet other embodiments, a MOSFET includes a semiconductor region, a gate electrode comprising a portion over the semiconductor region, a first dislocation plane adjacent to the gate electrode and in the semiconductor region, and a second dislocation plane adjacent to the gate electrode and in the semiconductor region. The first and the second dislocation planes are parallel to each other.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
  a metal-oxide-semiconductor field-effect transistor (MOSFET) comprising:
    a semiconductor region;
    a gate electrode comprising a portion over the semiconductor region;
    a first dislocation plane adjacent to the gate electrode and in the semiconductor region; and
    a second dislocation plane adjacent to the gate electrode and in the semiconductor region, wherein the first and the second dislocation planes are parallel to each other.

2. The device of claim 1, wherein the MOSFET is an n-type MOSFET.

3. The device of claim 1 further comprising a shallow trench isolation (STI) region adjacent to the MOSFET, wherein the STI region has a recess adjoining the semiconductor region, wherein the STI region has a recessed top surface under the recess, and wherein pitch-off lines of the first and the second dislocation planes are higher than the recessed top surface of the STI region.

4. The device of claim 1 further comprising a third dislocation plane adjacent to the gate electrode and in the semiconductor region, wherein the first, the second, and the third dislocation planes are parallel to each other.

5. The device of claim 1, wherein the first and the second dislocation planes extend in a longitudinal direction of the gate electrode, with the longitudinal direction parallel to a top surface of the semiconductor region.

6. The device of claim 1, wherein the MOSFET is a tri-gate MOSFET comprising a fin.

7. The device of claim 1 further comprising a silicide region over the semiconductor region and on a side of the gate electrode, wherein a bottom surface of the silicide region is higher than a top surface of a channel region of the MOSFET.

8. The device of claim 1 further comprising:
  a shallow trench isolation (STI) region adjacent to the MOSFET; and
  a recess in the STI region, wherein the recess adjoins the semiconductor fin, and wherein the STI region has a recessed top surface under the recess.

9. The device of claim 8, wherein pitch-off lines of the plurality of dislocation planes are higher than the recessed top surface of the STI region.

10. A device comprising:
   a metal-oxide-semiconductor field-effect transistor (MOSFET) comprising:
      a semiconductor fin;
      a gate electrode comprising a portion over the semiconductor fin;
      a source/drain region adjacent the gate electrode and disposed in the semiconductor fin; and
      a plurality of dislocation planes parallel to each other, wherein each of the plurality of dislocation planes comprises a portion in the source/drain region.

11. The device of claim 10, wherein the MOSFET is an n-type fin field-effect transistor (FinFET).

12. The device of claim 10, wherein pitch-off lines of the plurality of dislocation planes are higher than a bottom of the semiconductor fin.

13. The device of claim 10, wherein the plurality of dislocation planes comprises three dislocation planes.

14. The device of claim 10, wherein the plurality of dislocation planes extend in a longitudinal direction of the gate electrode, with the longitudinal direction parallel to a top surface of the semiconductor fin.

15. The device of claim 10 further comprising a silicide region over the semiconductor fin and on a side of the gate electrode, wherein a bottom surface of the silicide region is higher than a top surface of a channel region of the MOSFET.

* * * * *